(12) United States Patent
Duke et al.

(10) Patent No.: US 7,894,188 B2
(45) Date of Patent: Feb. 22, 2011

(54) EQUIPMENT CHASSIS SHIELD

(75) Inventors: Jeffrey A. Duke, Murphy, TX (US);
Raymond R. Sivahop, Plano, TX (US);
James E. Baker, Richardson, TX (US)

(73) Assignee: Verizon Patent and Licensing Inc. & Verizon Business Network Services Inc., Basking Ridge, NJ (US)

( * ) Notice: Subject to any disclaimer, the term of this patent is extended or adjusted under 35 U.S.C. 154(b) by 163 days.

(21) Appl. No.: 12/244,069

(22) Filed: Oct. 2, 2008

(65) Prior Publication Data

US 2010/0085703 A1   Apr. 8, 2010

(51) Int. Cl.
*G06F 1/16* (2006.01)
(52) U.S. Cl. .................. 361/679.58; 345/520; 248/625; 455/575.1
(58) Field of Classification Search .................. 345/719, 345/173, 520, 30, 156; 361/679.1, 679.27, 361/679.33, 679.34, 679.35, 679.37, 679.41, 361/679.06, 679.57, 679.58; 248/917, 346.01, 248/122.1, 625, 201, 220.1; 313/461, 422; 710/303, 304; 713/300, 320, 100; 455/425, 455/575.1, 556.1, 557
See application file for complete search history.

(56) References Cited

U.S. PATENT DOCUMENTS

| | | | | |
|---|---|---|---|---|
| 6,594,150 B2 * | 7/2003 | Creason et al. | ............. | 361/727 |
| 6,813,159 B2 * | 11/2004 | Irie et al. | .................... | 361/752 |
| 2003/0043182 A1 * | 3/2003 | Kroll | .......................... | 345/719 |

* cited by examiner

*Primary Examiner*—Hung V Duong

(57) ABSTRACT

An apparatus of an embodiment may include a network equipment chassis shield comprising a rectangular planar surface for mounting in front of a face of an equipment chassis, at least one supporting bracket for mounting the rectangular planar surface, and two or more fasteners for securing the rectangular planar surface to an anchoring structure. A first fastener may secure the rectangular planar surface to the at least one supporting bracket and a second fastener may secure the at least one supporting bracket to the anchoring structure.

20 Claims, 2 Drawing Sheets

EQUIPMENT CHASSIS SHIELD

BACKGROUND INFORMATION

Computers, such as servers and networking equipment may contain connections, wiring, settings, controls and other features that may be affected by unintentional contact. Computers may be centralized in server rooms with narrow aisles, numerous pieces of equipment, and a high amount of traffic. The accidental bumping or snagging of a connection, button, switch, lever or other component associated with a computer can cause an outage or service disruption.

BRIEF DESCRIPTION OF THE DRAWINGS

In order to facilitate a fuller understanding of the exemplary embodiments, reference is now made to the appended drawings. These drawings should not be construed as limiting, but are intended to be exemplary only.

DETAILED DESCRIPTION OF PREFERRED EMBODIMENTS

An exemplary embodiment provides a network equipment chassis shield. The network equipment chassis shield may protect one or more portions of network equipment from damage and/or disruption.

Figure 1:
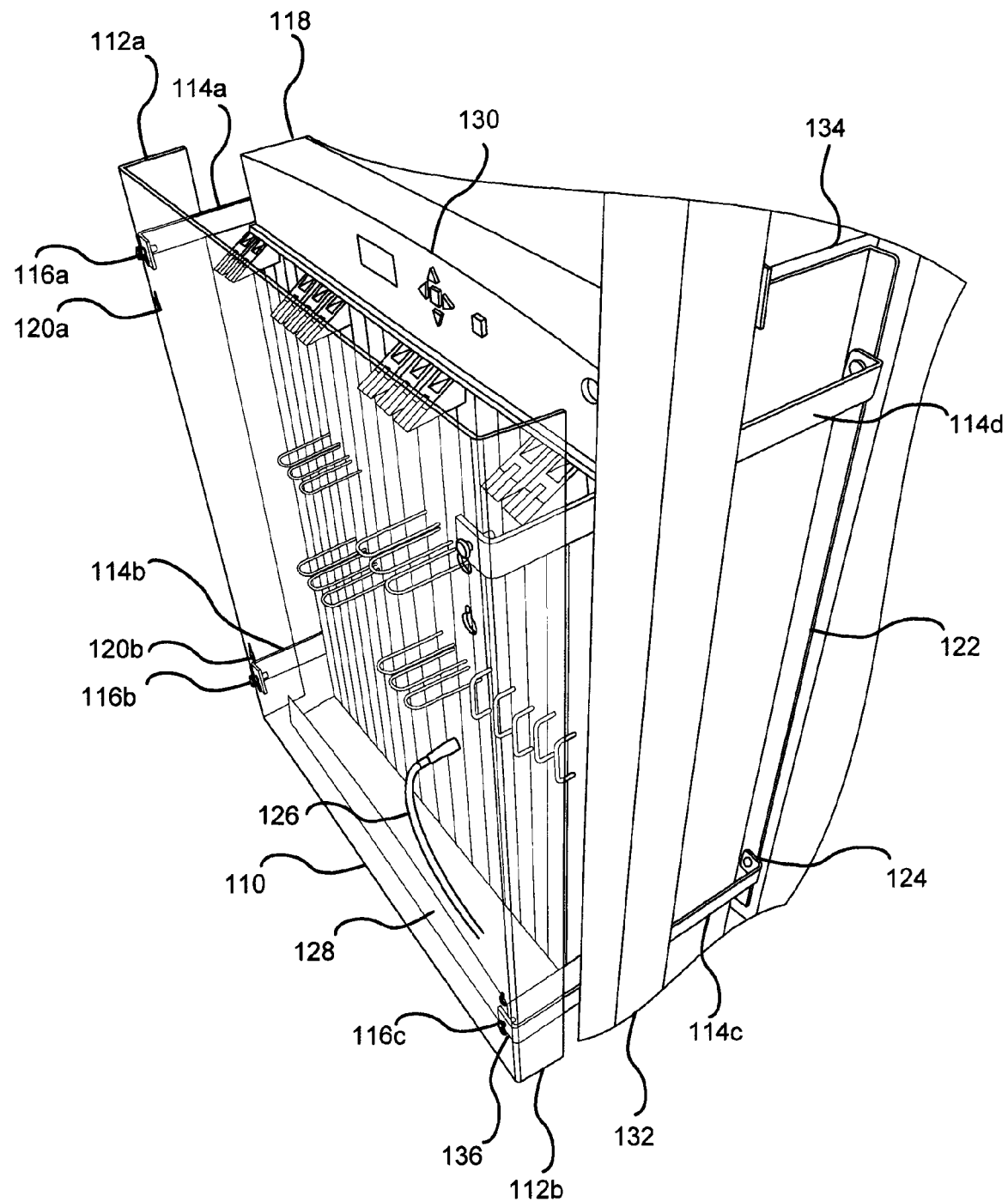
FIG. 1 is a perspective view of an equipment chassis shield attached to an equipment chassis, in accordance with an exemplary embodiment.

Referring to FIG. 1, a perspective view of an equipment chassis shield, in accordance with an exemplary embodiment, is illustrated. As illustrated, equipment chassis shield 110 may contain side panels 112a and 112b. Equipment chassis shield 110 may utilize support brackets 114a, 114b, 114c, and 114d for mounting, such as, mounting to equipment chassis 118 or mounting to a stable structure in close proximity to equipment chassis shield 110. Equipment chassis shield 110 may be fastened to one or more support brackets using fasteners, such as fasteners 116a, 116b, and/or 116c. Equipment chassis shield 110 may protect one or more areas of equipment chassis 118, such as network connection 126. Equipment chassis shield 110 may be mounted to permit access to control panel 130. For example, equipment chassis shield 110 may be mounted below control panel 130 or with enough clearance between equipment chassis shield 110 and control panel 130 to access control panel 130. Equipment chassis shield 110 may extend vertically from control panel 130 to a top lip of cable tray 128. Equipment chassis shield 110 may contain one or more openings, such as 120a, and 120b, which may be utilized for securing equipment chassis shield 110 to one or more support brackets.

Support brackets 114a, 114b, 114c, and/or 114d may be brackets, braces, ties, rods, or other supports for mounting equipment chassis shield 110. Support brackets 114a, 114b, 114c, and 114d may be composed of various materials such as metal, wood, and/or plastics. Support brackets 114a, 114b, 114c, and/or 114d may mount on an equipment rack holding the equipment chassis, on part of the equipment chassis itself, and/or on a structure in close proximity to an equipment chassis such as a wall. For example, support brackets 114a, 114b, 114c, and/or 114d may mount on one end to a flange or mounting bracket of the equipment chassis, such as equipment chassis mounting bracket 122. Support brackets 114a, 114b, 114c, and/or 114d may hold equipment chassis shield 110 in front of or over one or more areas of equipment chassis 118 in order to prevent damage or disruptions to equipment. Support brackets 114a, 114b, 114c, and 114d may extend from equipment chassis 118 a sufficient distance to accommodate side panels 112a and or 112b. The distance between equipment chassis 118 and equipment chassis shield 110 may permit sufficient clearance for components communicatively coupled to equipment chassis 118, such as network connection 126. The distance between equipment chassis 118 and an inner vertical edge of side panels 112a and 112b may permit air flow to facilitate ventilation. The distance may vary between equipment chassis 118 and equipment chassis shield 110. In one or more embodiments, the length of support brackets 114a, 114b, 114c, and/or 114d may be adjustable. In some embodiments, support brackets 114a, 114b, 114c, and/or 114d may be hinged and may enable one end of equipment chassis shield 110 to rotate away from equipment chassis 118. This may permit access to equipment chassis 118 without removing equipment chassis shield 110. Support brackets 114a, 114b, 114c, and 114d may anchor to different portions of a support structure, such as an equipment rack, which may enable the placement of one or more support brackets to avoid obstructions such as cable tray support 134.

Support brackets 114a, 114b, 114c, and 114d may be U-shaped and may contain a first end with a shield tab 124. Shield tab 124 may contain an opening permitting the use of a fastener such as a bolt or a screw. In some embodiments, shield tab 124 may be fastened by using glue, by welding, and/or by the use of a clamp, a pin, a peg, a clip, hook, or other fastener. Shield tab 124 may be approximately the length of a mounting flange, such as equipment chassis mounting bracket 122. This may enable the placement of one or more brackets adjacent to a side of equipment chassis 118 without hitting vertical obstructions such as vertical cable tray 132. The length of shield tab 124 may also enable equipment to be placed side by side, may enable cabling or other equipment to pass on either side of support brackets 114a, 114b, 114c, and 114d, and/or may permit air flow between the side of equipment chassis 118 and a support bracket.

The opposite end of support brackets 114a, 114b, 114c, and 114d may contain anchor tab 136. In some embodiments, anchor tab 136 may contain an opening for aligning with opening 120 of equipment chassis shield 110 in order to utilize a fastener, such as fastener 116c. In some embodiments, the opening in anchor tab 136 and or shield tab 124 may be threaded. Anchor tab 136 and/or shield tab 124 may contain a latch or hook for fastening into a slot on an equipment rack and/or equipment chassis shield 110. In one or more embodiments, anchor tab 136 and/or shield tab 124 may contain a notched protuberance that fits into a slot of a anchoring structure, such as an equipment rack, wherein the protuberance fits in the slot when a support bracket is rotated 90 degrees on its horizontal axis and locks into the slot when rotated back to a normal position. In one or more embodiments, anchor tab 136 and/or shield tab 124 may contain a stud or other protuberance with an outer peripheral flange enabling the fastening of a support bracket to a slotted structure. For example, anchor tab 136 may contain a stud enabling the fastening of support bracket 114c to equipment chassis shield 110. Anchor tab 136 may be longer than shield tab 124 and may permit additional support for equipment chassis shield 110.

Equipment chassis shield 110 may be designed to reduce damage or disruption to one or more network components, such as network connection 126. In one or more embodiments, network connection 126 may be a fiber optic network connection. An accidental bump in a server room may bend a fiber optic cable which may cause damage, signal degradation, signal loss, or other disruptions. Network cables such as network connection 126 may be dislodged or snagged. Power connections, connections to peripheral devices or other connections may be disrupted. An individual carrying tools or working on equipment adjacent to equipment chassis 118 or across from equipment chassis 118 may accidentally contact one or more portions of equipment chassis 118. The accidental contact may cause damage that is difficult to detect and/or difficult to diagnose. For example, a fiber optic connection may be bent beyond a critical angle which may cause signal degradation. User interfaces or controls such as buttons, switches, and levers on equipment chassis 118 may be accidentally touched which may affect settings. The seating of one or more network cards or other components in equipment chassis 118 may also be affected. Equipment chassis shield 110 may reduce these and other disruptions. Equipment chassis shield 110 may be transparent or may contain one or more transparent portions. Thus, lights, controls, connections, and other indicators may be visible through equipment chassis shield 110 when it is mounted on equipment chassis 118.

Equipment chassis shield 110 may contain one or more side panels, such as side panels 112a and 112b. Side panels 112a and 112b may reduce snagging or other disruptions. In some embodiments, top panels and/or bottom panels may be utilized.

Equipment chassis shield 110 may be composed of one or more materials such as plexiglass, glass, plastics, and/or metal. In one or more embodiments, equipment chassis shield may be composed of a non-conducting material, such as a plastic, that insulates equipment chassis 118 from electrical charges. Equipment chassis shield 110 may be grounded. In some embodiments, a front panel and one or more side panels of equipment chassis shield 110 may formed as a continuous surface. For example, a solid sheet of plexiglass with two vertical bends at either side which may be utilized to form the front panel and two side panels of equipment chassis shield 110. Equipment chassis shield 110 may form a single u-shaped shield protecting a front face of equipment chassis 118. In some embodiments, multiple separate panels may be utilized.

Equipment chassis shield 110 may have a width sized to protect one or more sensitive areas of an equipment chassis such as an area holding traffic bearing network cards. The width of equipment chassis shield 110 may be larger than that of equipment chassis 118. The width of equipment chassis shield 110 may permit support brackets 114a, 114b, 114c, and 114d to attach to an inside of equipment chassis shield 110. Equipment chassis shield 110 may extend horizontally to protect one or more sensitive areas of equipment chassis 118. In some embodiments, equipment chassis shield 110 may have openings (not shown) permitting ventilation and/or access to one or more controls. Equipment chassis shield 110 may be designed to avoid covering air intakes or ventilation of an equipment chassis.

Equipment chassis shield 110 may be produced in different sizes and different configurations to protect different types and makes of equipment. For example, in one or more embodiments equipment chassis shield 110 may be designed to protect one or more areas of a Tellabs 8860 Multi-Service IP Switch or Multi-Service IP Router. In such embodiments, equipment chassis shield 110 may be approximately 29.75 inches high by 24 inches wide and may be composed ⅛ inch thick clear plastic. Equipment chassis shield 110 may contain bends of approximately ninety degrees at either side extending the shield an additional two inches on each side to form side panels. The support brackets for such embodiments may be one inch wide by 12.5 inches long. The support brackets may be composed of 3/16 inch thick steel. In one or more additional embodiments equipment chassis shield 110 may be designed to protect one or more areas of a Juniper M320, M160 and/or M40 router. The Juniper M320, M160, and/or M40 routers may require different widths and/or heights of equipment chassis shield 110. The mounting points and/or openings in equipment chassis shield 110 may vary by embodiments. Additional dimensions may vary as well. The support brackets utilized for such embodiments may vary in dimension and/or composition from those of other embodiments. Thermal measurements may be taken for one or more embodiments to ensure adequate airflow and/or ventilation. Additional ventilation openings may be added, the distance between equipment chassis shield 110 and equipment chassis 118 may be increased and/or decreased, the height of equipment chassis shield 110 may be raised or lowered, or other measures may be taken to ensure equipment chassis 118 receives adequate ventilation. In some embodiments, equipment chassis shield 110 may be made of a thermally conductive material, such as metal, to improve heat dissipation.

The various components of system 100 as shown in FIG. 1 may be further duplicated, combined and/or integrated to support various applications and platforms. Additional elements may also be implemented in the systems described above to support various applications.

Figure 2:
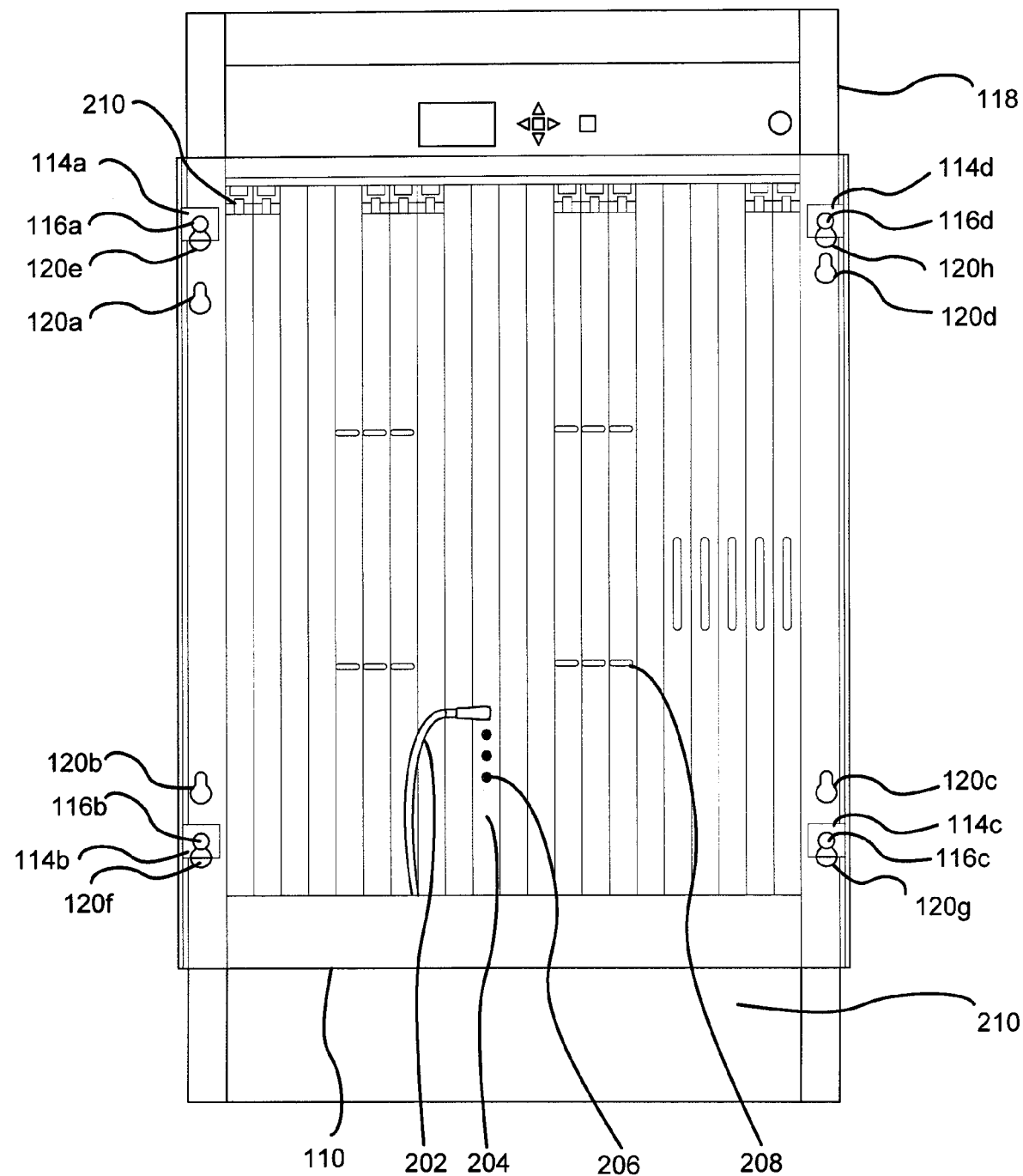
FIG. 2 is a front view of an equipment chassis shield attached to an equipment chassis, in accordance with an exemplary embodiment.

Referring to FIG. 2, a front view of an equipment chassis shield is depicted, in accordance with an exemplary embodiment. As illustrated, equipment chassis shield 110 may contain support brackets 114a, 114b, 114c, and/or 114d. Support brackets 114a, 114b, 114c, and/or 114d may be fastened utilizing fasteners 116a, 116b, 116c, and/or 116d. Fasteners 116a, 116b, 116c, and/or 116d may utilize screws, bolts, clamps, glue, studs, rivets and/or other fasteners to couple equipment chassis shield 110 to support brackets 114a, 114b, 114c, and/or 114d. Fasteners 116a, 116b, 116c, and/or 116d may pass through openings 120e, 120f, 120g and/or 120h to fasten equipment chassis shield 110 to support brackets 114a, 114b, 114c, and/or 114d. Equipment chassis shield 110 may contain additional openings such as 120a, 120b, 120c and/or 120d which may enable support brackets 114a, 114b, 114c, and/or 114d to be mounted at different heights relative to equipment chassis 118. This may enable support brackets 114a, 114b, 114c, and/or 114d to be mounted to avoid obstructions such as cable stays, cabling or other structures. Openings 120 may be oblong, slotted openings which may permit the insertion of the head or outer peripheral flange of a fastener at the lower end of a slot. The upper end of an opening 120 may be narrower and may enable the secure fastening of equipment chassis shield 110 to one or more support brackets. This may permit the removal and/or installation of equipment chassis shield 110 by loosening one or more fasteners and sliding equipment chassis shield 110 upward and then outward away from equipment chassis 118. Other fastening mechanisms may be utilized which may also permit the removal of equipment chassis shield 110.

Equipment chassis shield 110 may enable the protection of one or more components of equipment chassis 118, such as network card 204. Equipment chassis shield 110 may prevent the disruption of network cable 202 and/or card latch 210. Equipment chassis shield 110 may provide sufficient clearance for one or more components such as network cable 202 and/or cable guide 208. Equipment chassis shield 110 may enable a user to clearly view one or more indicators located behind the shield such as LED indicator 206. Equipment chassis shield 110 may be constructed so as not to impede airflow to vent 210.

In the preceding specification, various preferred embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The invention claimed is:

1. A network equipment chassis shield comprising:
   a rectangular planar surface for mounting in front of a face of an equipment chassis;
   at least one supporting bracket for mounting the rectangular planar surface; and
   two or more fasteners for securing the rectangular planar surface to an anchoring structure, wherein a first fastener secures the rectangular planar surface to the at least one supporting bracket and a second fastener secures the at least one supporting bracket to the anchoring structure,
   wherein the network equipment chassis shield extends horizontally a width of the network equipment chassis and extends vertically from above one or more network interface openings on a face of the network equipment chassis to below an outer lip of a horizontal fiber tray extending from a bottom portion of the network equipment chassis.

2. The network equipment chassis shield of claim 1, wherein the securing of the network equipment chassis shield provides sufficient space between a face of the network equipment chassis and the network equipment chassis shield for one or more network cables communicatively coupled to the face of the network equipment chassis.

3. The network equipment chassis shield of claim 1, wherein the network equipment chassis shield further comprises a network equipment chassis shield containing two or more vertically aligned slotted openings having a lower first portion wider than a flange of each of the two or more fasteners and an adjoining upper second portion of the slotted opening narrower than the flange of each of the two or more fasteners and wider than a body of each of the fasteners, wherein the slotted openings permit the rectangular planar surface to be slid over the flange of the fasteners and then lowered onto the body of the fastener so that the narrower upper second portion of the slotted opening holds the rectangular planar surface against each of the flanges of the two or more fasteners.

4. The network equipment chassis shield of claim 1, wherein the two or more fasteners comprise screws and wherein the at least one supporting bracket contains a first tab at one end for securing the supporting bracket to an anchoring structure and a second tab at the other end for securing the rectangular planar surface and at least one of the first tab and the second tab of the at least one supporting bracket contains a threaded hole for securing the screws.

5. The network equipment chassis shield of claim 4, wherein the two or more fasteners comprise studs extending from each of the second tabs of the at least one supporting bracket, the studs having a peripheral flange at one end and a body narrower than the flange extending from the second tab a distance longer than the thickness of the rectangular planar surface to the peripheral flange.

6. The network equipment chassis shield of claim 1, wherein the at least one supporting bracket comprises a metal bracket.

7. The network equipment chassis shield of claim 1, wherein the anchoring structure is an equipment rack containing the network equipment chassis.

8. The network equipment chassis shield of claim 1, wherein the anchoring structure is the network equipment chassis.

9. The network equipment chassis shield of claim 1, wherein the network equipment chassis shield comprises a transparent network equipment chassis shield.

10. The network equipment chassis shield of claim 1, wherein the network equipment chassis shield is plexiglass.

11. The network equipment chassis shield of claim 1, wherein the network equipment chassis shield further comprises a network equipment chassis shield containing a pair of openings, the pair of openings horizontally aligned, wherein the pair of openings enables the securing of the network equipment chassis shield utilizing a first fastener to pass through a first opening to secure to a first supporting bracket adjacent to a left side of the network equipment chassis and a second fastener to pass through a second opening to secure to a second supporting bracket adjacent to a right side of the network equipment chassis.

12. The network equipment chassis shield of claim 11, further comprising a plurality of pairs of horizontally aligned openings, enabling the securing of the network equipment chassis shield utilizing support brackets placed at varying heights.

13. The network equipment chassis shield of claim 1, wherein the network equipment chassis shield comprises:
    a first rectangular planar surface; and
    a second rectangular planar surface, adjacent to a side of the first rectangular planar surface and perpendicular to the first rectangular planar surface, the second rectangular planar surface containing two or more openings for fastening the second rectangular planar surface to the at least one supporting bracket, wherein the second rectangular planar surface extends from the first rectangular planar surface towards the network equipment chassis to form a side of the network equipment chassis shield.

14. The network equipment chassis shield of claim 1, wherein the rectangular planar surface contains one or more openings for ventilation.

15. A network equipment chassis shield comprising:
    a u-shaped cover containing three rectangular planar surfaces, the first rectangular planar surface is generally parallel to a face of a network equipment chassis, the first rectangular planar surface extending vertically approximately the width of the network equipment chassis and bending at one or more sides approximately ninety degrees to form one or more second rectangular planar surfaces generally perpendicular to the first planar surface;
    two or more supporting brackets for coupling the u-shaped cover to an anchoring structure; and
    two or more fasteners for securing the u-shaped cover, wherein the u-shaped cover is mounted in front of a network equipment chassis utilizing the two or more fasteners to secure the u-shaped cover to the two or more supporting brackets.

16. The network equipment chassis shield of claim 15, wherein the two or more fasteners comprise at least one of: screws, bolts, clamps, glue, studs, latches, and rivets.

17. The network equipment chassis shield of claim 15, wherein the first rectangular planar surface extends vertically from above one or more network interface openings on a face of the network equipment chassis to below an outer lip of a horizontal fiber tray extending from a bottom portion of the face of the network equipment chassis.

18. The network equipment chassis shield of claim 15, wherein the mounting of the u-shaped cover provides sufficient space between the front of the network equipment chassis and the u-shaped cover for one or more fiber optic network cables communicatively coupled to the front of the network equipment chassis.

19. The network equipment chassis shield of claim 15, wherein the first rectangular planar surface contains a pair of openings, the pair of openings horizontally aligned, wherein the pair of openings enables the mounting of the u-shaped cover utilizing a supporting bracket adjacent to a left side of the network equipment chassis and a supporting bracket adjacent to a right side of the network equipment chassis.

20. A network equipment chassis shield comprising:
  a u-shaped cover containing three vertically aligned rectangular planar surfaces, the first vertically aligned rectangular planar surface is generally parallel to a face of a network equipment chassis, the first vertically aligned rectangular planar surface containing two or more openings for fastening the first vertically aligned rectangular planar surface to two or more supporting brackets, and the first vertically aligned rectangular planar surface extending vertically approximately the width of the network equipment chassis and bending at one or more sides approximately ninety degrees to form one or more second vertically aligned rectangular planar surfaces generally perpendicular to the first vertically aligned rectangular planar surface;
  two or more supporting brackets for coupling the u-shaped cover to an anchoring structure, the brackets each containing a first tab at one end for securing the bracket and a second tab at the other end for mounting the u-shaped cover; and
  two or more fasteners for securing the u-shaped cover, wherein the u-shaped cover is mounted in front of a network equipment chassis utilizing the two or more fasteners, each fastener passing through one of the two or more openings of the first vertically aligned rectangular planar surface to secure the u-shaped cover to the two or more supporting brackets.

* * * * *